(12) United States Patent
Lee

(10) Patent No.: US 11,404,478 B2
(45) Date of Patent: Aug. 2, 2022

(54) ELECTRONIC DEVICE AND METHOD OF MANUFACTURING THE SAME

(71) Applicant: SK hynix Inc., Icheon (KR)

(72) Inventor: Young Sam Lee, Icheon (KR)

(73) Assignee: SK hynix Inc., Icheon (KR)

( * ) Notice: Subject to any disclaimer, the term of this patent is extended or adjusted under 35 U.S.C. 154(b) by 35 days.

(21) Appl. No.: 16/892,012

(22) Filed: Jun. 3, 2020

(65) Prior Publication Data

US 2021/0104576 A1  Apr. 8, 2021

(30) Foreign Application Priority Data

Oct. 8, 2019 (KR) .......................... 10-2019-0124871

(51) Int. Cl.
| | | |
|---|---|---|
| H01L 27/118 | (2006.01) | |
| H01L 21/82 | (2006.01) | |
| H01L 27/24 | (2006.01) | |
| H01L 27/22 | (2006.01) | |

(52) U.S. Cl.
CPC ........ H01L 27/2409 (2013.01); H01L 27/224 (2013.01)

(58) Field of Classification Search
CPC .................. H01L 27/2463; H01L 27/2409

USPC .................................. 438/128–133; 257/206
See application file for complete search history.

(56) References Cited

U.S. PATENT DOCUMENTS

| | | | |
|---|---|---|---|
| 9,773,844 B2 | 9/2017 | Ravasio et al. | |
| 9,941,333 B2 * | 4/2018 | Jeong | G11C 13/0004 |
| 10,461,127 B2 * | 10/2019 | Park | H01L 45/06 |
| 10,547,001 B2 * | 1/2020 | Kang | H01L 27/2463 |
| 10,998,499 B2 * | 5/2021 | Lee | H01L 45/1253 |
| 2018/0175109 A1 * | 6/2018 | Choi | H01L 45/08 |

FOREIGN PATENT DOCUMENTS

| | | | | |
|---|---|---|---|---|
| JP | 3745403 | * | 10/2018 | ............. G06C 21/75 |
| KR | 20130123931 A | | 11/2013 | |

* cited by examiner

*Primary Examiner* — Calvin Lee

(57) ABSTRACT

An electronic device includes a semiconductor memory. The semiconductor memory includes row lines, insulating lines extending parallel to the row lines, column lines intersecting with the row lines and the insulating lines and disposed over the row lines and the insulating lines, memory cells respectively disposed at intersections between the row lines and the column lines, and dummy memory cells respectively disposed at intersections between the insulating lines and the column lines.

14 Claims, 14 Drawing Sheets

ELECTRONIC DEVICE AND METHOD OF MANUFACTURING THE SAME

CROSS-REFERENCE TO RELATED APPLICATION

The present application claims priority under 35 U.S.C. § 119(a) to Korean Patent Application Number 10-2019-0124871, filed on Oct. 8, 2019, in the Korean Intellectual Property Office, the entire disclosure of which is incorporated herein by reference.

BACKGROUND

1. Technical Field

Various embodiments of the present disclosure generally relate to an electronic device, and more particularly, to an electronic device including a semiconductor memory and a method of manufacturing the electronic device.

2. Related Art

Recently, with requirement of miniaturization, low power consumption, high performance, and diversification of electronic apparatuses, semiconductor devices configured to store information are needed in various electronic apparatuses such as computers and portable communication apparatuses. Therefore, there has been research on semiconductor devices configured to store data using characteristics of switching between different resistance phases depending on applied voltage or current. Examples of such semiconductor devices include a resistive random access memory (RRAM), a phase-change random access memory (PRAM), a ferroelectric random access memory (FRAM), a magnetic random access memory (MRAM), an E-fuse, and so forth.

SUMMARY

An embodiment of the present disclosure is directed to an electronic device including a semiconductor memory. The semiconductor memory may include: row lines; insulating lines extending parallel to the row lines; column lines intersecting with the row lines and the insulating lines and disposed over the row lines and the insulating lines; memory cells respectively disposed at intersections between the row lines and the column lines; and dummy memory cells respectively disposed at intersections between the insulating lines and the column lines.

An embodiment of the present disclosure may provide for a method of manufacturing an electronic device including a semiconductor memory. The method may include: providing a base layer including a cell region and a dummy region; forming a first conductive material layer over the base layer; forming a dummy trench by etching the first conductive material layer disposed in the dummy region; forming an insulating layer in the dummy trench; forming a cell stack structure on the first conductive material layer and the insulating layer; forming cell patterns and row lines in the cell region by etching the cell stack structure and the first conductive material layer, respectively; and forming dummy cell patterns and insulating lines in the dummy region by etching the cell stack structure and the insulating layer, respectively.

BRIEF DESCRIPTION OF THE DRAWINGS

FIGS. 4A to 9A, 4B to 9B, 9C, and 10 are diagrams for describing a method of manufacturing an electronic device according to an embodiment of the present disclosure.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure are directed to an electronic device having improved operating characteristics and reliability, and a method of fabricating the electronic device.

Figure 1A:
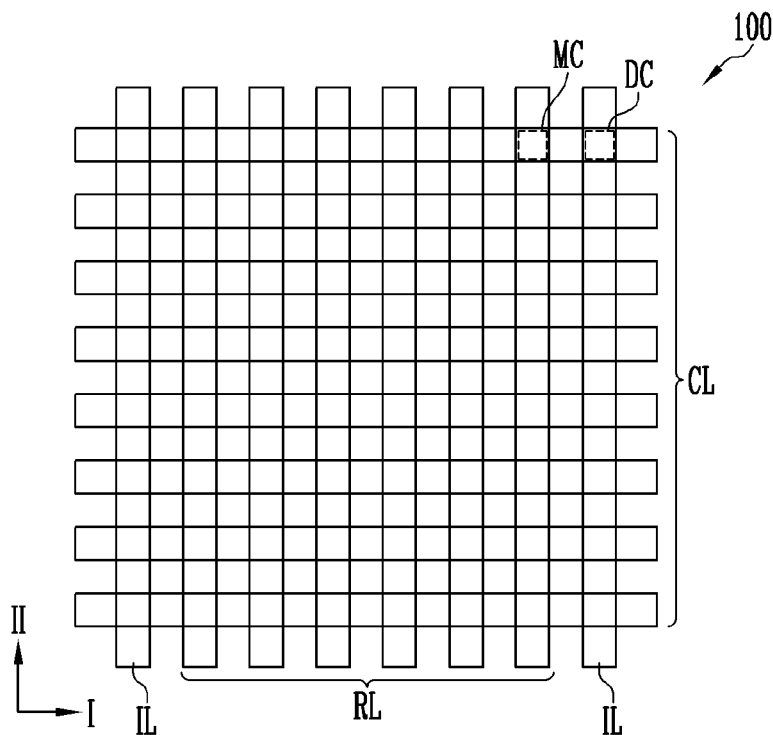
FIGS. 1A and 1B are diagrams illustrating an electronic device in accordance with embodiments of the present disclosure.
Figure 1B:
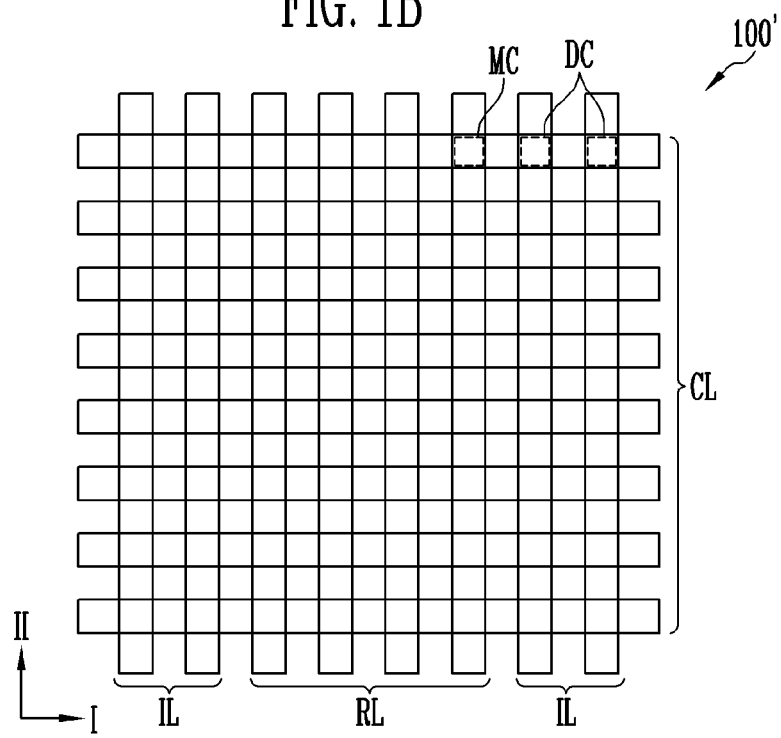

FIGS. 1A and 1B are diagrams illustrating an electronic device in accordance with embodiments of the present disclosure.

Referring to FIGS. 1A and 1B, the electronic device may include a semiconductor memory device. The semiconductor memory device may be a nonvolatile memory device or a variable resistance memory device.

The semiconductor memory device may include a cell array 100 or 100'. The cell array 100 or 100' may include row lines RL, insulating lines IL, and column lines CL. The row lines RL and the insulating lines IL may extend parallel to each other in a second direction II. At least a portion of each of the row lines RL and at least a portion of each of the insulating lines IL may be disposed on substantially the same level in a third direction III crossing a first direction I and the second direction II as shown in FIGS. 2A to 3B.

The column lines CL may be disposed on a level different from those of the row lines RL and the insulating lines IL in the third direction III. The column lines CL may intersect with the row lines RL and the insulating lines IL. The column lines CL may extend parallel to each other in the first direction I that crosses the second direction II. Here, the row lines RL may be word lines, and the column lines CL may be bit lines. For reference, the notions of the terms "word lines" and "bit lines" may be relative to each other. Hence, alternatively, the row lines RL may be bit lines, and the column lines CL may be word lines.

The memory cell array 100 or 100' may include memory cells MC respectively disposed between the column lines CL and the row lines RL in the third direction III. Here, the memory cells MC may be disposed at respective intersections between the column lines CL and the row lines RL.

Each of the memory cells MC may include at least one of a selection element and a memory element. The memory element may be a storage node configured to store data, and include a variable resistance material. The selection element may be configured to select the corresponding memory cell MC, and include a switching material. A shape and a configuration of each of the memory cells MC may be changed in various ways. For example, the selection element may be omitted, or the memory element may be omitted.

The memory cell array 100 or 100' may include dummy memory cells DC respectively disposed between the insulating lines IL and the column lines CL in the third direction III. The dummy memory cells DC may be disposed at intersections between the insulating lines IL and the column lines CL. The dummy memory cells DC may be disposed on substantially the same level as that of the memory cells MC in the third direction III. The dummy memory cells DC may include a structure and a material corresponding to those of the memory cells MC.

The cell array 100 or 100' may include at least one insulating line IL. For example, the insulating lines IL may be disposed at edges of the cell array 100 or 100', and the insulating lines IL may be disposed on opposite sides of a region in which the row lines RL are disposed. Referring to FIG. 1A, the cell array 100 may include an insulating line IL disposed on each of the opposite sides of the region in which the row lines RL are disposed, in the first direction I. Referring to FIG. 1B, the cell array 100' may include a plurality of insulating lines IL, e.g., two insulating lines IL, disposed on each of the opposite sides of the region in which the row lines RL are disposed, in the first direction I.

Figure 2A:
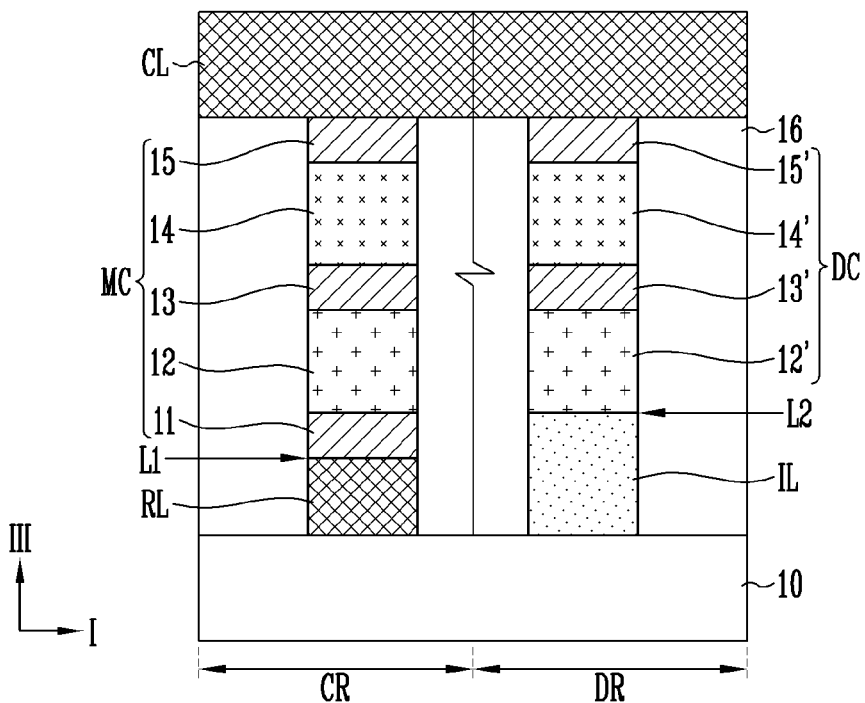
FIGS. 2A and 2B are diagrams illustrating an electronic device according to an embodiment of the present disclosure.
Figure 2B:
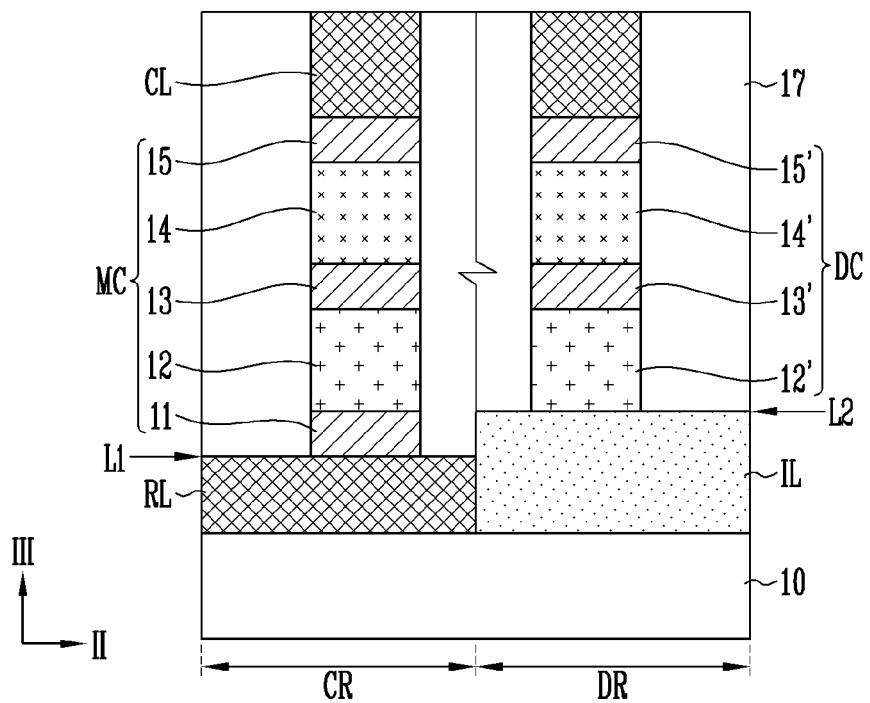

FIGS. 2A and 2B are diagrams illustrating an electronic device according to an embodiment of the present disclosure. FIG. 2A is cross-sectional view taken along the first direction I of FIG. 1, and FIG. 2B is a cross-sectional view taken along the second direction II of FIG. 1.

Referring to FIGS. 2A and 2B, the electronic device may include row lines RL, insulating lines IL, memory cells MC, dummy memory cells DC, and column lines CL. The electronic device may further include a base 10, a first insulating layer 16, and a second insulating layer 17.

The base 10 may include a cell region CR and a dummy region DR. The cell region CR may be a region in which the memory cells MC are disposed. The dummy region DR may be a region in which the dummy memory cells DC are disposed. The row lines RL and the memory cells MC may be disposed in the cell region CR. The insulating lines IL and the dummy memory cells DC may be disposed in the dummy region DR. The column lines CL may be disposed in the cell region CR and the dummy region DR so that the column lines CL cross the row lines RL disposed in the cell region CR and the insulating lines IL disposed in the dummy region DR.

Each of the memory cells MC may include a lower electrode 11, a switching layer 12, an intermediate electrode 13, a variable resistance layer 14, and an upper electrode 15, or may include at least one of them. The positions of the switching layer 12 and the variable resistance layer 14 may be relative to each other, and may be switched with each other.

The variable resistance layer 14 may have characteristics of switching between different resistance states depending on a voltage or current applied thereto. Therefore, if the variable resistance layer 14 has a low-resistance state, data '1' may be stored therein. If the variable resistance layer 14 has a high-resistance state, data '0' may be stored therein.

In the case where the variable resistance layer 14 is formed of a resistance material, the variable resistance layer 14 may include a transition metal oxide or a metal oxide such as perovskite-based material. Hence, data may be stored in the variable resistance layer 14 by generating or removing an electrical path in the variable resistance layer 14 according to the voltage or current applied to the variable resistance layer 14.

In the case where the variable resistance layer 14 has a magnetic tunnel junction (MTJ) structure, the variable resistance layer 14 may include a magnetization pinned layer, a magnetization free layer, and a tunnel barrier layer. The tunnel barrier layer may be interposed between the magnetization pinned layer and the magnetization free layer. For example, the magnetization pinned layer and the magnetization free layer may include a magnetic material. The tunnel barrier layer may include an oxide including one or more of magnesium (Mg), aluminum (Al), zinc (Zn), and titanium (Ti). Here, a magnetization direction of the magnetization free layer may change depending on a spin torque of electrons in a current applied thereto. Therefore, depending on a change in the magnetization direction of the magnetization free layer with respect to a magnetization direction of the magnetization pinned layer, data may be stored.

If the variable resistance layer 14 is formed of a phase-change material, it may include a chalcogenide-based material. The variable resistance layer 14 may include, as the chalcogenide-based material, silicon (Si), germanium (Ge), antimony (Sb), tellurium (Te), bismuth (Bi), indium (In), tin (Sn), selenium (Se), or a combination thereof. For example, the variable resistance layer 14 may have a Ge—Sb—Te (GST) structure, and be formed of $Ge_2Sb_2Te_5$, $Ge_2Sb_2Te_7$, $Ge_1Sb_2Te_4$, or $Ge_1Sb_4Te_7$. Here, a chemical composition rate of the variable resistance layer 14 may be determined based on characteristics such as a melting point and a crystallization temperature. The variable resistance layer 14 may further include impurities such as carbon (C) and nitrogen (N). The phase-change material has a low-resistance characteristic in a crystalline state, and has a high-resistance characteristic in an amorphous state. Therefore, data may be stored in the variable resistance layer 14 by performing a set operation of changing the variable resistance layer 14 from the amorphous state having the high-resistance characteristic to the crystalline state having the low-resistance characteristic or a reset operation of changing the variable resistance layer 14 from the crystalline state having the low-resistance characteristic to the amorphous state having the high-resistance characteristic.

The switching layer 12 may be a selection element for adjusting a flow of current therein depending on a level of a voltage or current applied thereto. The switching layer 12 may have characteristics such that, if the level of the voltage or current applied thereto is equal to or lower than a predetermined threshold value, a current seldom flows through the switching layer 12, and if the level of the voltage or current applied thereto is higher than the predetermined threshold value, a rapidly increasing current flows through the switching layer 12.

In the case where the switching layer 12 is a metal insulator transition (MIT) element, the switching layer 12 may include one or more of $VO_2$, $NbO_2$, $TiO_2$, $WO_2$, etc. In the case where the switching layer 12 is a mixed ion-electron conducting (MIEC) element, the switching layer 12 may include one or more of $ZrO_2(Y_2O_3)$, $Bi_2O_3$—BaO, $(La_2O_3) \times (CeO_2)_{1-x}$, etc. In the case where the switching layer 12 is an ovonic threshold switching (OTS) element, the switching layer 12 may include one or more of Te, Se, Ge, Si, As, Ti, S, Sb, etc. For example, the switching layer 12 may include a chalcogenide-based material such as AsTe, AsSe, AsTeSe, AsTeGe, AsSeGe, AsTeGeSe, or the like.

The lower electrode 11 may be electrically coupled with the row line RL. The intermediate electrode 13 may be interposed between the switching layer 12 and the variable resistance layer 14. The upper electrode 15 may be electrically coupled with the column line CL. Hence, the memory cell MC may be electrically coupled to and disposed between the column line CL and the row line RL.

The lower electrode 11, the intermediate electrode 13, and the upper electrode 15 may include a conductive material such as a metal or a metal nitride. For example, each of the lower electrode 11, the intermediate electrode 13, and the upper electrode 15 may include one of tungsten (W), tungsten nitride (WN), tungsten silicide (WSi), titanium (Ti), titanium nitride (TiN), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), and a combination thereof.

Each of the dummy memory cells DC may include a switching layer 12', an intermediate electrode 13', a variable resistance layer 14', and an upper electrode 15', or may include at least one of them. The switching layer 12' may include the same material as that of the switching layer 12. The intermediate electrode 13' may include the same material as that of the intermediate electrode 13. The upper electrode 15' may include the same material as that of the upper electrode 15. The positions of the switching layer 12' and the variable resistance layer 14' may be relative to each other, and may be switched with each other.

The intermediate electrode 13' may be interposed between the switching layer 12' and the variable resistance layer 14'. The upper electrode 15' may be electrically coupled with the column line CL. Since the insulating line IL, instead of the row line RL, is disposed in the dummy region DR, the dummy memory cell DC is not electrically coupled with the row line RL. Therefore, the dummy memory cell DC may not be electrically enabled.

Each of the dummy memory cells DC may include a lower electrode or may not include the lower electrode. As shown in FIGS. 2A and 2B, when the dummy memory cell DC does not include the lower electrode, an upper surface of the insulating line IL may be disposed at a level L2 in the third direction III and thus level with an upper surface of the lower electrode 11. In another embodiment, when the dummy memory cell DC includes a lower electrode corresponding to the lower electrode 11, the upper surface of the insulating line IL may be disposed at a level L1 and thus level with an upper surface of the row line RL.

The first insulating layer 16 and the second insulating layer 17 may fill a space between adjacent memory cells MC, a space between adjacent dummy memory cells DC, and a space between a memory cell MC and a dummy memory cell DC that are adjacent to each other. The first insulating layer 16 may fill a space between structures adjacent to each other in the first direction I. The second insulating layer 17 may fill a space between structures adjacent to each other in the second direction II. The first insulating layer 16 and the second insulating layer 17 may include a flowable oxide such as spin-on coating (SOC) or spin-on dielectric (SOD), or an oxide such as a silicon oxide (SiO$_2$), or may include a combination of those materials.

Figure 3A:
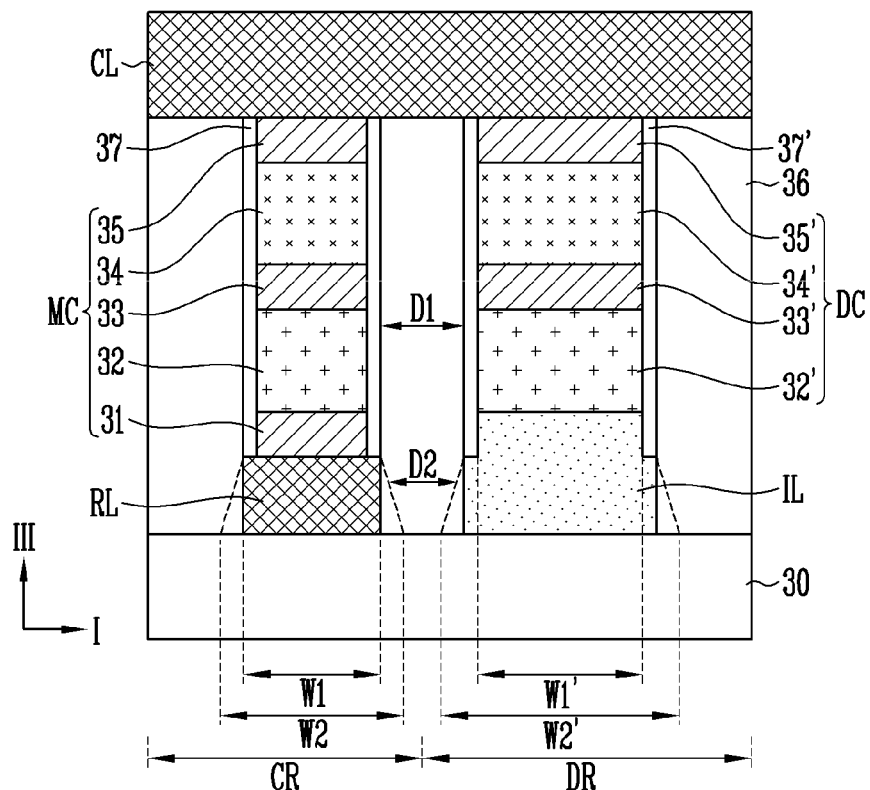
FIGS. 3A and 3B are diagrams illustrating electronic devices according to embodiments of the present disclosure.
Figure 3B:
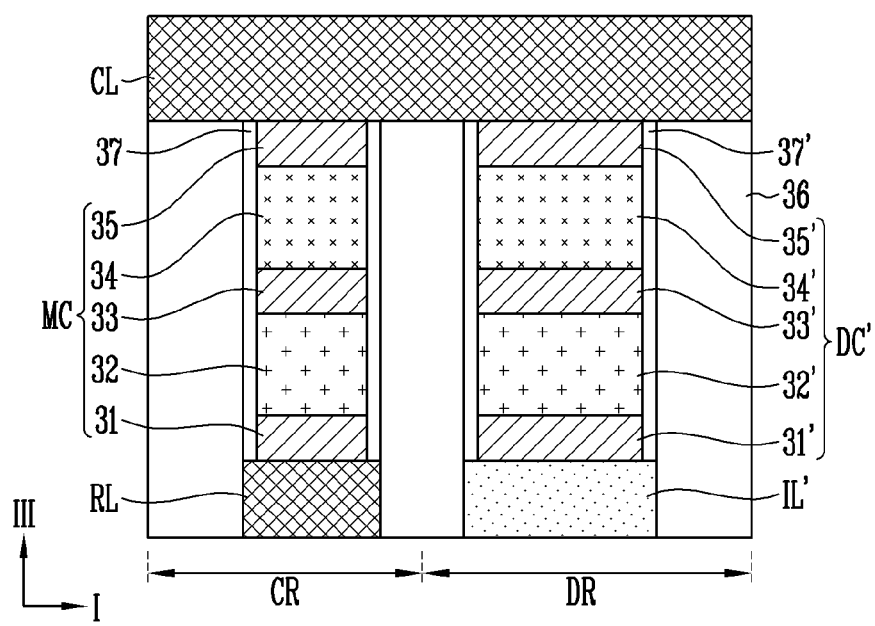

FIGS. 3A and 3B are diagrams illustrating electronic devices according to embodiments of the present disclosure. FIGS. 3A and 3B are cross-sectional views taken along the first direction I of FIG. 1. Hereinbelow, repetitive explanation will be omitted if deemed redundant.

Referring to FIGS. 3A and 3B, the electronic devices may include a base 30, row lines RL, insulating lines IL, memory cells MC, dummy memory cells DC and DC', and column lines CL. The electronic device may further include an insulating layer 36, a liner layer 37, and a dummy liner layer 37'.

The row lines RL, the memory cells MC, and the liner layer 37 may be disposed in a cell region CR. The insulating lines IL, the dummy memory cells DC, and the dummy liner layer 37' may be disposed in a dummy region DR. The column lines CL may be disposed in the cell region CR and the dummy region DR so that the column lines CL cross the row lines RL disposed in the cell region CR and the insulating lines IL disposed in the dummy region DR.

Each memory cell MC and each dummy memory cell DC or DC' may have the same width or different widths in the first direction I. In FIGS. 3A and 3B, the dummy memory cells DC and DC' may have a width greater than that of the memory cells MC. Each row line RL and each insulating line IL may have the same width or different widths in the first direction I. In FIGS. 3A and 3B, the insulating line IL may have a width greater than that of the row line RL.

The row line RL may have an upper width W1 and a lower width W2 that have substantially the same value, or may be formed such that the upper width W1 is smaller than the lower width W2. For example, the cross-section of the row line RL with respect to the first direction I may have a tapered shape, or the row line RL may have vertical-profiled sidewalls. The insulating line IL may have an upper width W1' and a lower width W2' that have substantially the same value, or may be formed such that the upper width W1' is smaller than the lower width W2'. For example, the cross-section of the insulating line IL with respect to the first direction I may have a tapered shape, or the insulating line IL may have vertical-profiled sidewalls.

Each of the memory cells MC may include a lower electrode 31, a switching layer 32, an intermediate electrode 33, a variable resistance layer 34, and an upper electrode 35, or may include at least one of them. Each of the dummy memory cells DC and DC' may include a switching layer 32', an intermediate electrode 33', a variable resistance layer 34', and an upper electrode 35', or may include at least one of them.

The dummy memory cell DC or DC' may further include a lower electrode or may not include the lower electrode. Referring to FIG. 3A, the dummy memory cell DC may include no lower electrode. In this case, an upper surface of the insulating line IL may be level with an upper surface of the lower electrode 31. Referring to FIG. 3B, the dummy memory cell DC' may include a lower electrode 31'. In this case, the upper surface of the insulating line IL may be level with an upper surface of the row line RL.

The liner layer 37 may be formed on sidewalls of the memory cell MC. The liner layer 37 may be formed on the sidewalls of the memory cell MC that are opposite to each other in the first direction I. The dummy liner layer 37' may be formed on sidewalls of the dummy memory cell DC. The dummy liner layer 37' may be formed on the sidewalls of the dummy memory cell DC that are opposite to each other in the first direction I. The liner layer 37 may fully cover the sidewalls of the memory cell MC or cover some of the sidewalls of the memory cell MC. The liner layer 37 may extend in the third direction III to fully or partially cover sidewalls of the row line RL. The dummy liner layer 37' may fully cover the sidewalls of the dummy memory cell DC or cover some of the sidewalls of the dummy memory cell DC. The dummy liner layer 37' may extend in the third direction III to cover sidewalls of the insulating line IL. The dummy liner layer 37' may fully cover the sidewalls of the insulating line IL or cover some of the sidewalls of the insulating line IL.

When the row line RL is formed, an etching process is performed through a space having a large aspect ratio. Hence, the sidewalls of the row line RL may be etched in an inclined shape (refer to dotted lines). In other words, the row line RL may be etched in a tapered shape. As the liner layer 37 and the dummy liner layer 37' are formed, a distance D1 between the memory cell MC and the dummy memory cell DC that are adjacent to each other may be reduced, and an aspect ratio of a space between the memory cell MC and the dummy memory cell DC may be increased. Therefore, a degree to which the row line RL is tapered may be exacerbated. Thus, if the row line RL is formed in the dummy region DR, a distance D2 between adjacent row lines RL may be reduced, so that a bridge may be generated between the adjacent row lines RL. Particularly, it is likely that a bridge is generated between the row lines RL in a boundary between the cell region CR and the dummy region DR. On the other hand, in accordance with an embodiment of the present disclosure, since the insulating line IL rather than the row line RL is formed in the dummy region DR, a bridge may be prevented from being generated between adjacent row lines RL.

FIGS. 4A to 9A, 4B to 9B, 9C, and 10 are diagrams for describing a method of manufacturing an electronic device according to an embodiment of the present disclosure. FIGS. 4A to 9A show plan views of the electronic device, and FIGS. 4B to 9B and 9C show cross-sectional views of the electronic device. For the sake of understanding the present disclosure, the plan views will be shown by focusing on a first conductive material layer, row lines, or insulating lines. Hereinbelow, repetitive explanation will be omitted if deemed redundant.

Figure 4A:
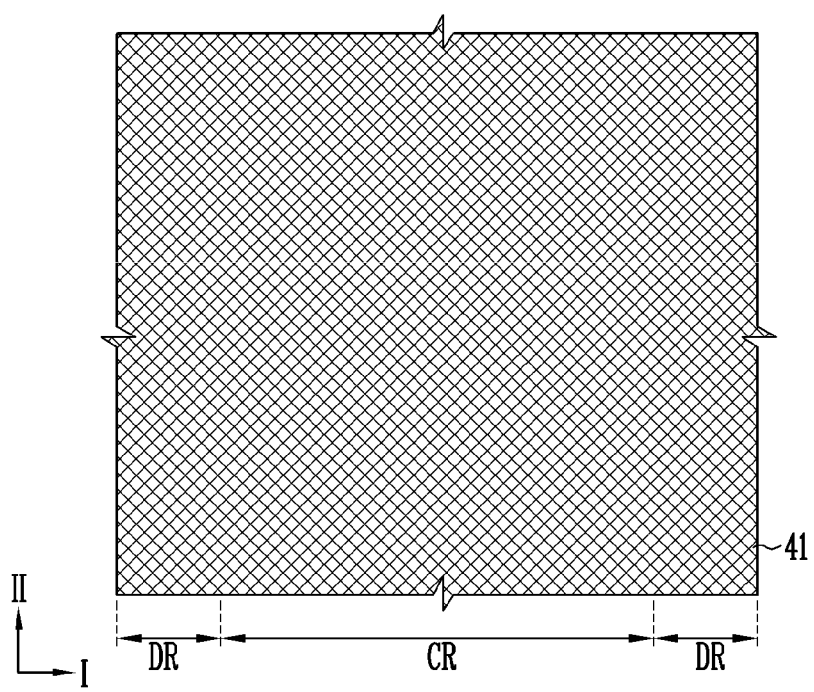
Figure 4B:
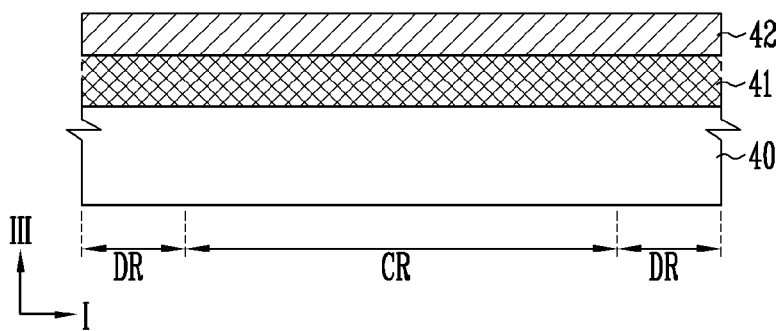

Referring to FIGS. 4A and 4B, a first conductive material layer 41 may be formed on a base 40. For example, the base 40 may include a semiconductor substrate and an insulating layer. The base 40 may include a cell region CR and dummy regions DR. The cell region CR may be disposed between the dummy regions DR in the first direction I. Alternatively, dummy regions DR and cell regions CR may be alternately arranged in the first direction I. The first conductive material layer 41 may be provided to form row lines and include a metal such as tungsten. The first conductive material layer 41 may be formed in the cell region CR and the dummy regions DR.

Thereafter, a lower electrode material layer 42 may be formed on the first conductive material layer 41. The first conductive material layer 41 and the lower electrode material layer 42 may be stacked in the third direction III. The third direction III may be perpendicular to a plane defined in the first direction I and the second direction II. The lower electrode material layer 42 may be formed in the cell region CR and the dummy regions DR. The process of forming the lower electrode material layer 42 may be skipped.

Figure 5A:
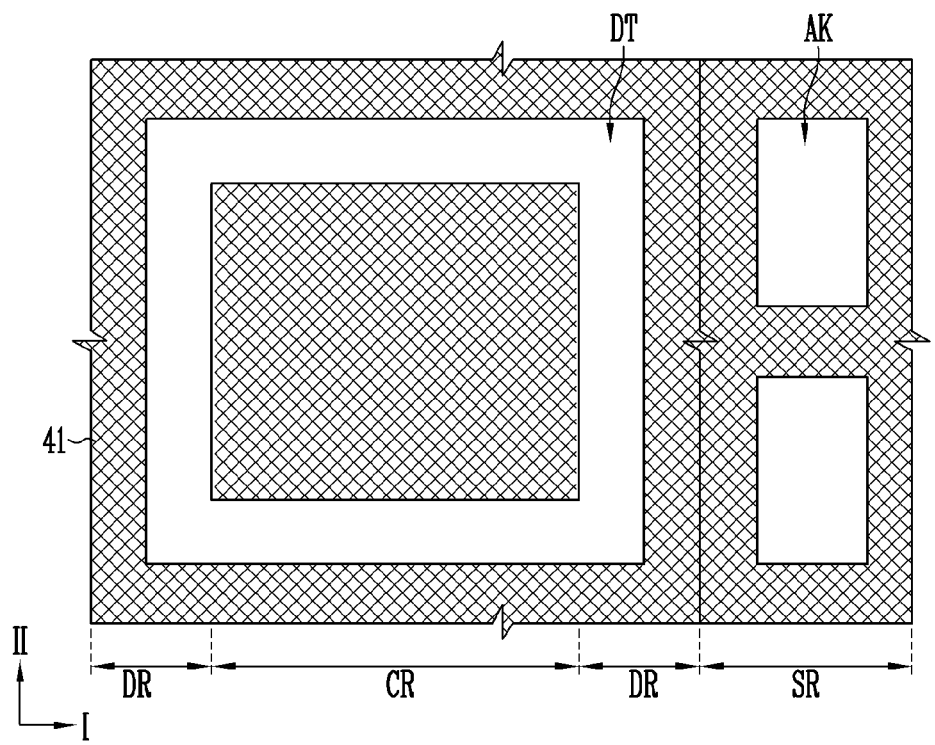
Figure 5B:
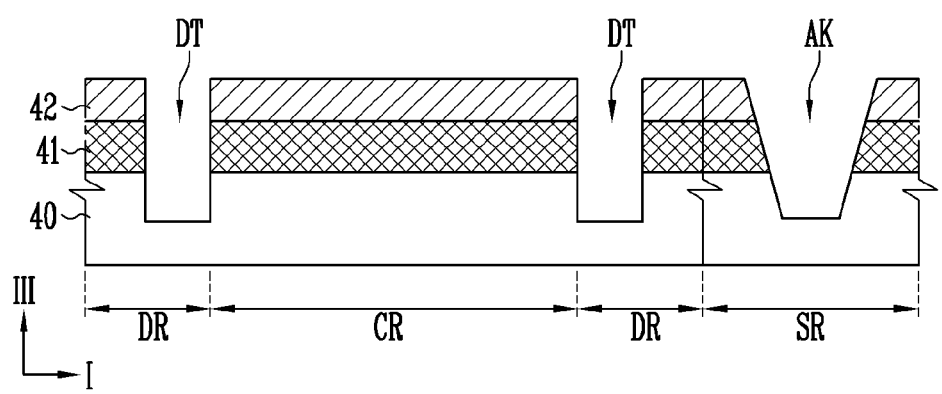

Referring to FIGS. 5A and 5B, a dummy trench DT may be formed to pass through the lower electrode material layer 42 and the first conductive material layer 41. The dummy trench DT may be disposed in the dummy region DR. By forming the dummy trench DT, the lower electrode material layer 42 and the first conductive material layer 41 may be patterned, and portions of the lower electrode material layer 42 and the first conductive material layer 41 that are formed in the dummy region DR may be removed. The dummy trench DT may be formed in the entirety of the dummy regions DR, or in a portion of the dummy regions DR as shown in FIGS. 5A and 5B. The dummy trench DT may have a depth extending to the base 40, so that some of an upper portion of the base 40 is removed when forming the dummy trench DT.

The dummy trench DT may have a line shape extending in the second direction II. Alternatively, the dummy trench DT may have a frame shape extending along a perimeter of the cell region CR to surround the cell region CR, as shown in FIG. 5A.

When the dummy trench DT is formed, an alignment key AK may be also formed, as shown in FIGS. 5A and 5B. Since the process of forming the dummy trench DT and the process of forming the alignment key AK are simultaneously performed, the entire manufacturing process may be simplified. The alignment key AK may be disposed in a scribe lane region SR or around a cell array.

Figure 6A:
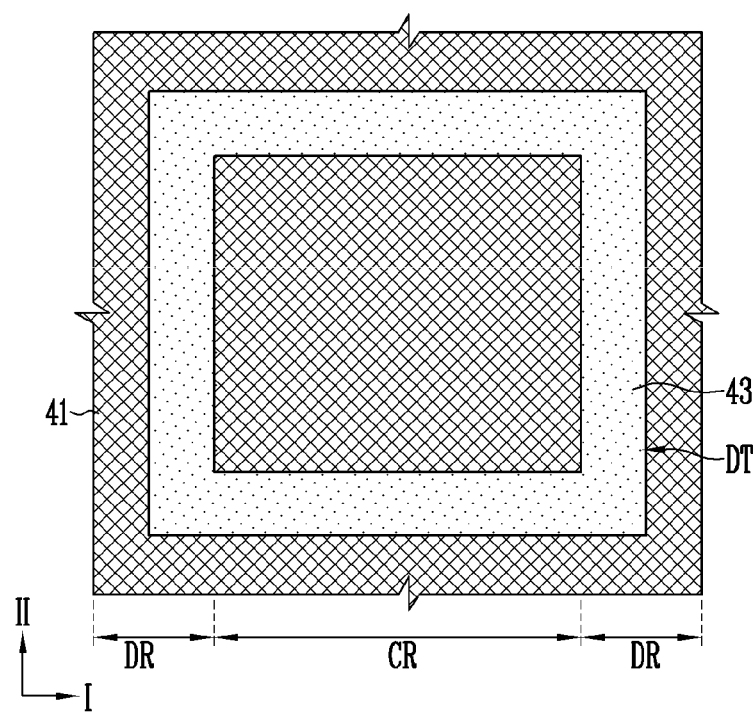
Figure 6B:
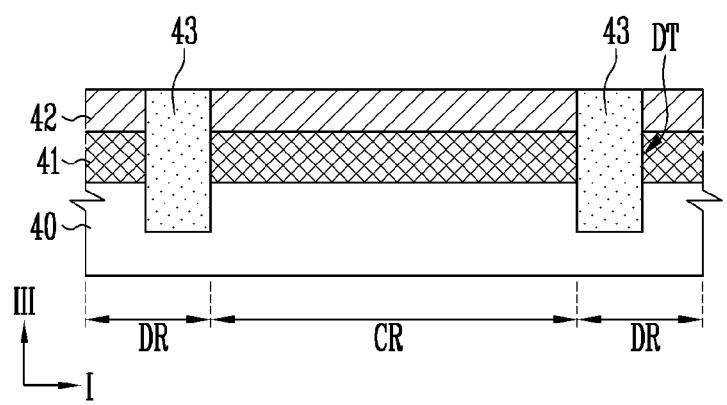

Referring to FIGS. 6A and 6B, an insulating layer 43 may be formed in the dummy trench DT. For example, the insulating layer 43 may be formed by filling the dummy trench DT with an insulating material and then planarizing the insulating material. A chemical mechanical polishing (CMP) may be used to planarize the insulating material.

Figure 7A:
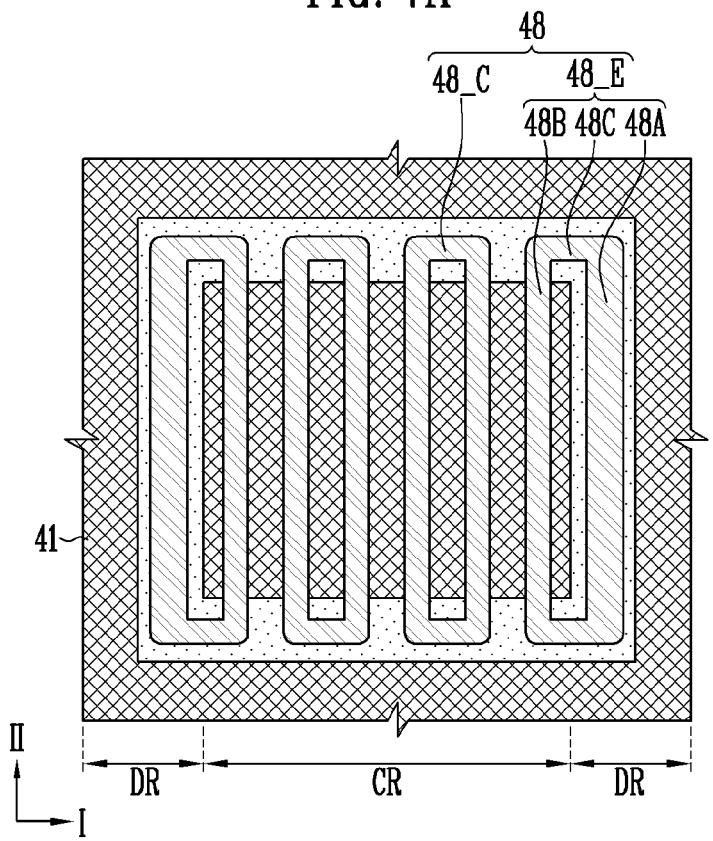
Figure 7B:
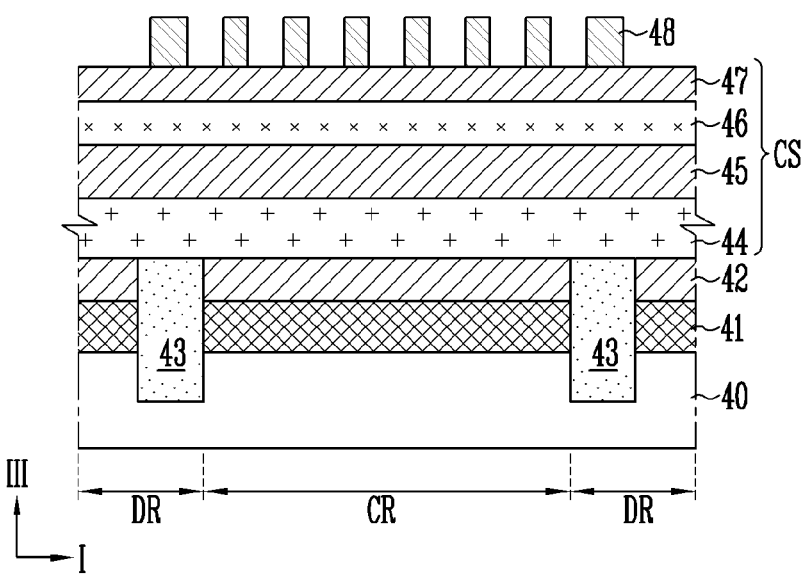

Referring to FIGS. 7A and 7B, a cell stack structure CS may be formed. The cell stack structure CS may be formed in the cell region CR and the dummy regions DR and formed on the first conductive material layer 41, the lower electrode material layer 42, and the insulating layer 43. The cell stack structure CS may include a switching material layer 44, an intermediate electrode material layer 45, a variable resistance material layer 46, and an upper electrode material layer 47, or include at least one of them. In the embodiment illustrated in FIGS. 4A and 4B, if the lower electrode material layer 42 is not formed before the dummy trench DT is formed, the cell stack structure CS may further include a lower electrode material layer. For example, the switching material layer 44 may be formed after forming the lower electrode material layer on the first conductive material layer 41 and the insulating layer 43.

Subsequently, a mask pattern 48 is formed on the cell stack structure CS. A spacer patterning technology (SPT) may be used to form the mask pattern 48. The mask pattern 48 may include patterns 48_C and 48_E each having a loop shape. Each of the patterns 48_C and 48_E may include line patterns 48A and 48B which extend in the second direction II, and a connection pattern 48C which connects the line patterns 48A and 48B to each other. The patterns 48_C and 48_E may have a uniform width or different widths. For example, either or both of some patterns (e.g., 48_E) disposed in the dummy region DR, and edges of the cell region CR may have a greater width than some patterns (e.g., 48_C) disposed in the cell region CR. As shown in FIGS. 7A and 7B, in the pattern 48_E, the line pattern 48A disposed in the dummy region DR may have a greater width than the line pattern 48B disposed in the cell region CR.

The patterns 48_C and 48_E may be disposed in the cell region CR, in the dummy region DR, or in both the cell region CR and the dummy region DR. In the pattern 48_E that is disposed in an outer portion of a pattern area where the mask pattern 48 is formed, the line pattern 48A and the connection pattern 48C may be disposed in the dummy region DR, and the line pattern 48B may be disposed in the cell region CR. In the pattern 48_C that is disposed in an inner portion of the pattern area, the connection pattern 48C may be disposed in the dummy region DR, and the line patterns 48A and 48B may be disposed in the cell region CR.

Figure 8A:
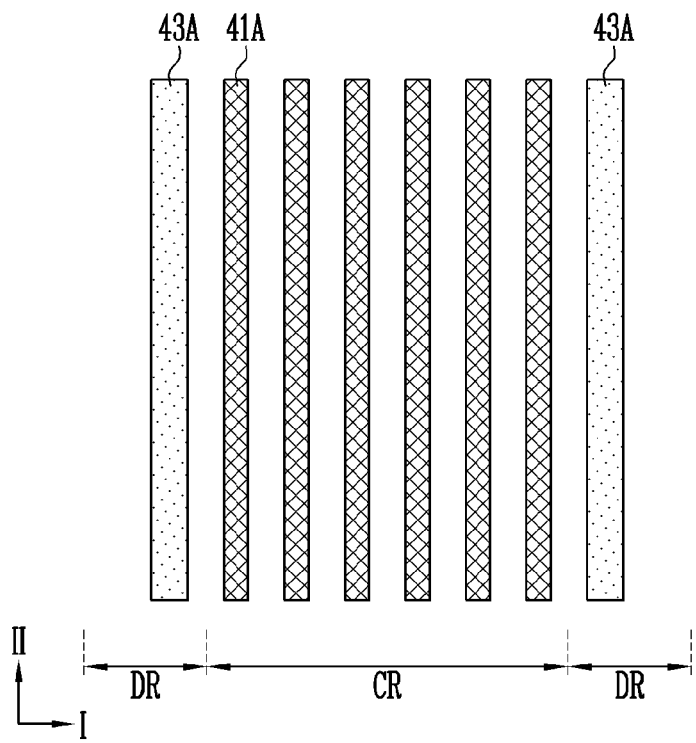
Figure 8B:
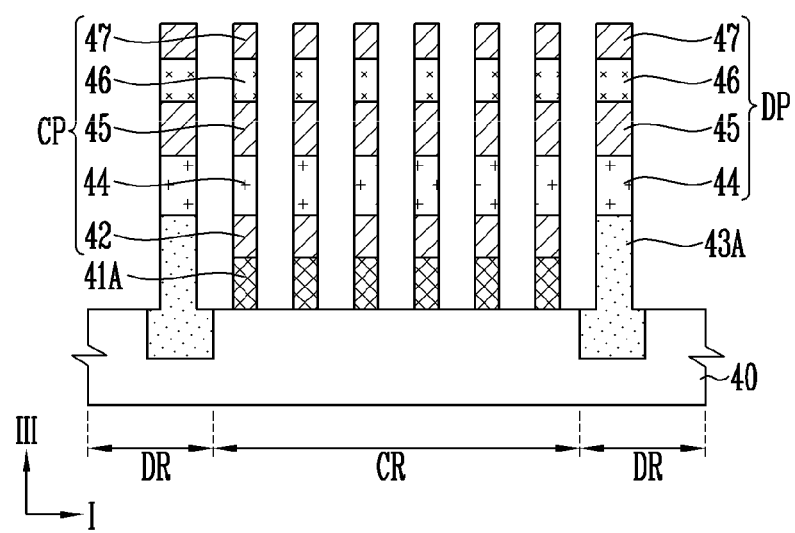

Referring to FIGS. 8A and 8B, the cell stack structure CS, the lower electrode material layer 42, and the first conductive material layer 41 may be etched using the mask pattern 48 as an etching barrier. Thereby, cell patterns CP and row lines 41A may be formed in the cell region CR. In addition, the cell stack structure CS, the lower electrode material layer 42, and the insulating layer 43 may be etched using the mask pattern 48 as an etching barrier. Thereby, dummy cell patterns DP and insulating lines 43A may be formed in the dummy regions DR.

The row lines 41A may be formed in a shape corresponding to the mask pattern 48. Here, since a portion of the first conductive material layer 41 disposed in the dummy region DR has been previously removed when forming the insulating layer 43 and the mask pattern 48 is formed to remove the remaining portion of the first conductive material layer 41 disposed in the dummy region DR, the row line 41A may not be formed in the dummy region DR. Instead, the insulating lines 43A may be formed in the dummy region DR.

Furthermore, in the case where the dummy trench DT has a frame shape, the connection pattern 48C of the mask pattern 48 may be disposed directly over the insulating layer 43. Therefore, even when the etching process is performed using the mask pattern 48 having a loop shape, the row lines 41A each having a line shape rather than a loop shape may be formed.

Each of the cell patterns CP may include patterns of the lower electrode material layer 42, the switching material layer 44, the intermediate electrode material layer 45, the variable resistance material layer 46, and the upper electrode material layer 47, or include at least one of them. Each of the dummy cell patterns DP may include patterns of the switching material layer 44, the intermediate electrode material layer 45, the variable resistance material layer 46, and the upper electrode material layer 47, or may further include a pattern of a lower electrode material layer, or include at least one of them.

When the cell patterns CP are formed, the dummy cell patterns DP may be formed. That is, the cell patterns CP and the dummy cell patterns DP are formed at the same time by the same etching process. Furthermore, when the row lines 41A are formed, the insulating lines 43A may be formed. The first conductive material layer 41 and the insulating layer 43 may be etched under conditions in which the first conductive material layer 41 and the insulating layer 43 have substantially the same etching selectivity. Thereby, the row lines 41A and the insulating lines 43A each having vertical profiled sidewalls may be formed.

Although FIGS. 8A and 8B illustrate that a single insulating line 43A is formed in each dummy region DR, a plurality of insulating lines 43A may be formed in each dummy region DR.

Figure 9A:
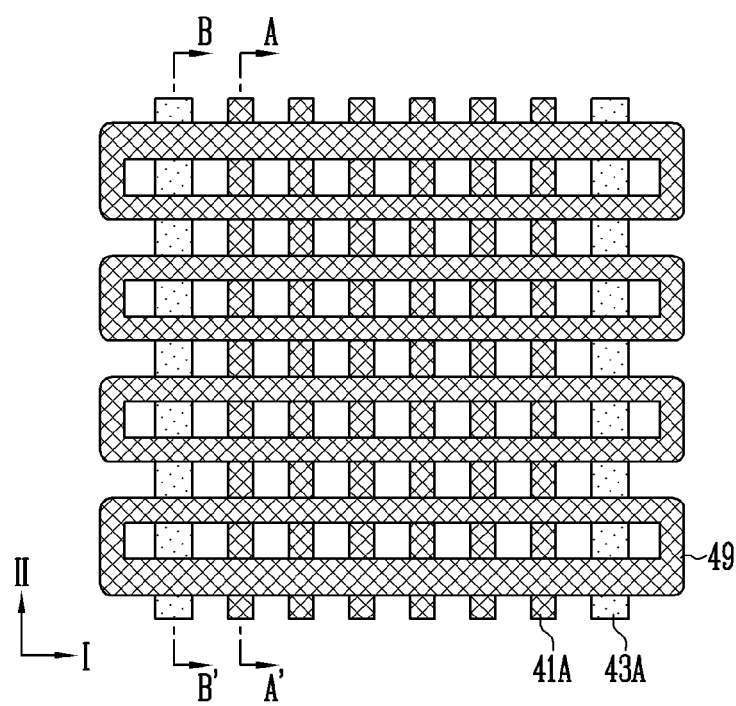
Figure 9B:
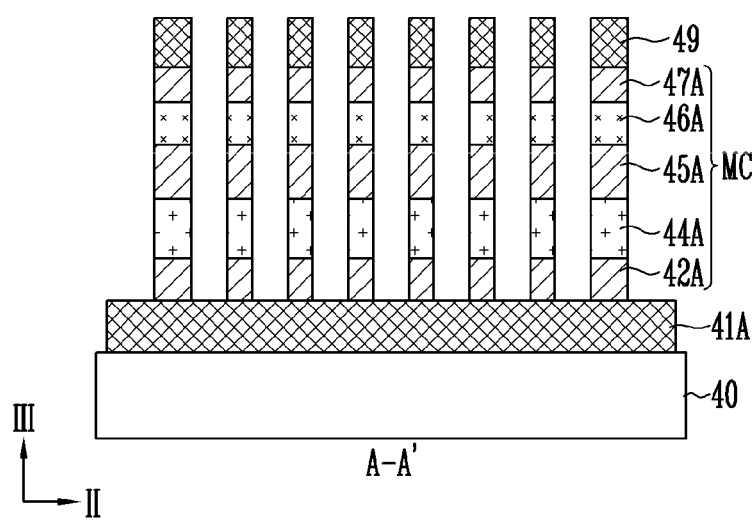
Figure 9C:
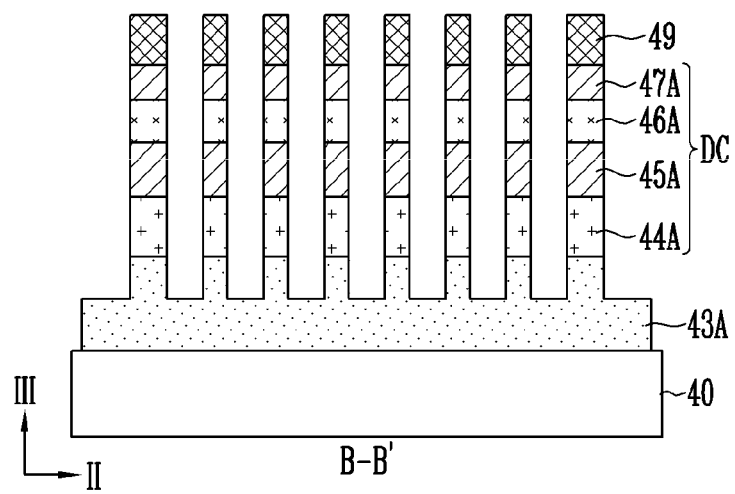

Referring to FIGS. 9A to 9C, column lines 49, memory cells MC, and dummy memory cells DC may be formed. For example, after an insulating layer has been formed such that spaces between the cell patterns CP, between the dummy cell patterns DP, between the row lines 41A, and between the insulating lines 43A are filled with the insulating layer, a second conductive material layer may be formed on the insulating layer, the cell patterns CP, and the dummy cell patterns DP. Thereafter, a mask pattern may be formed on the second conductive material layer. The mask pattern may be formed in an SPT scheme. Subsequently, the second conductive material layer, the cell patterns CP, and the dummy cell patterns DP may be etched using the mask pattern as an etching barrier.

Referring to FIGS. 9A and 9B, the column lines 49 and the memory cells MC may be formed by etching the second conductive material layer and the cell patterns CP. The column lines 49 may intersect with the row lines 41A, and each of the column lines 49 may have a loop shape so that two line-shape column lines are connected to form one loop-shape column line 49. Each of the memory cells MC may include a lower electrode 42A, a switching layer 44A, an intermediate electrode 45A, a variable resistance layer 46A, and an upper electrode 47A, or may include at least one of them. The memory cells MC may be disposed on respective intersections between the column lines 49 and the row lines 41A.

Referring to FIGS. 9A and 9C, the column lines 49 and the dummy memory cells DC may be formed by etching the second conductive material layer and the dummy cell patterns DR. The column lines 49 may intersect with the insulating lines 43A.

When the memory cells MC are formed, the dummy memory cells DC may be formed. Therefore, when the cell patterns CP are etched, the insulating lines 43A may be partially etched to a predetermined depth. The dummy memory cells DC may include a structure and materials corresponding to the memory cells MC. Each of the dummy memory cells DC may include a switching layer 44A, an intermediate electrode 45A, a variable resistance layer 46A, and an upper electrode 47A, or may include at least one of them. The dummy memory cells DC may be disposed on respective intersections between the column lines 49 and the insulating lines 43A.

Figure 10:
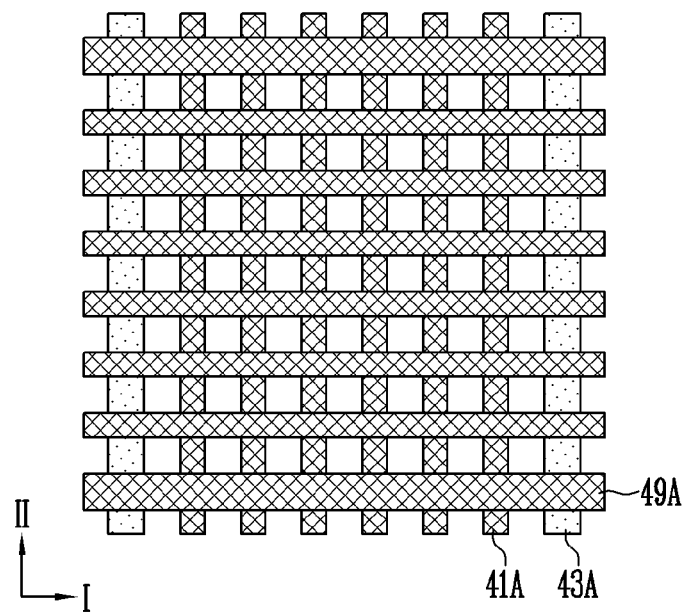

Referring to FIG. 10, the loop-shape column lines 49 may be etched to remove connection patterns thereof. Thereby, column lines 49A having line shapes extending parallel in the first direction I may be formed. In another embodiment, when column lines are directly formed in a line shape rather than a loop shape, the step of etching the connection patterns of the loop-shape column lines 49 may be skipped.

In the manufacturing method described above, the row lines 41A may be formed after portions of the first conductive material layer 41 disposed in the dummy regions DR are removed in advance. Therefore, no row line 41A is formed in the dummy regions DR, and the dummy memory cells DC may not be electrically coupled with the row lines 41A. Thereby, the dummy memory cells DC that are electrically disabled may be easily formed.

Figure 11:
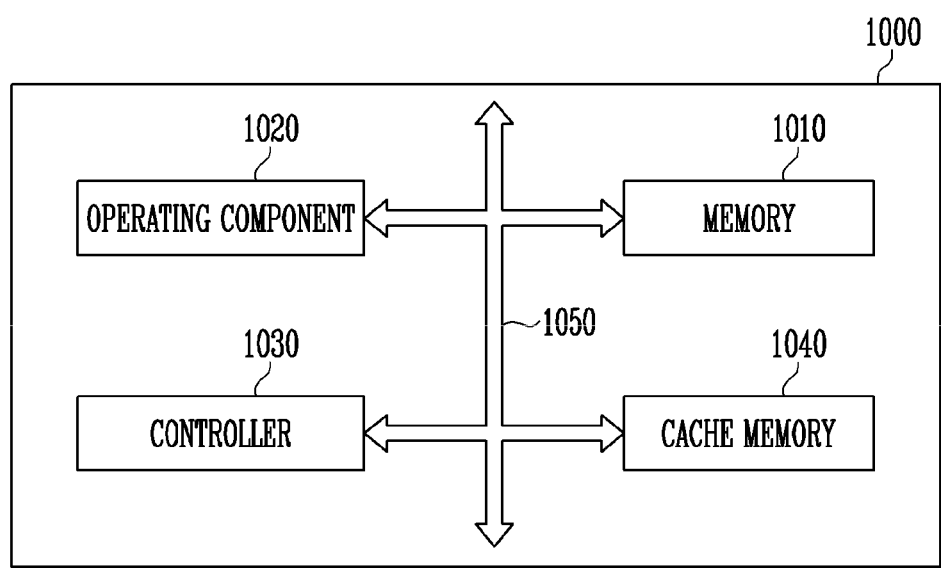
FIG. 11 is a diagram illustrating a microprocessor which embodies a memory device in accordance with the embodiment.

FIG. 11 is a diagram illustrating a microprocessor which embodies a memory device in accordance with the embodiment.

Referring to FIG. 11, a microprocessor 1000 may perform tasks for controlling and tuning a series of processes of receiving data from various external devices, processing the data, and outputting processing results to external devices. For example, the microprocessor 1000 may include a memory 1010, an operating component 1020, and a controller 1030. The microprocessor 1000 may be various data processors such as a central processing unit (CPU), a graphic processing unit (GPU), a digital signal processor (DSP) and an application processor (AP).

The memory 1010 may be a circuit configured to store data in the microprocessor 1000 as a processor register, a register, or the like. For example, the memory 1010 may include a data register, an address register, and a floating point register. In addition, the memory 1010 may include various registers. The memory 1010 may perform the function of temporarily storing data for which operations are to be performed by the operating component 1020, result data of performing the operations, and addresses where data for performing of the operations are stored.

The memory 1010 may include one or more of the semiconductor devices in accordance with the above-described embodiments. For example, the memory 1010 may include: row lines; insulating lines extending parallel to the row lines; column lines which intersect with the row lines and the insulating lines and are disposed over the row lines and the insulating lines; memory cells disposed between the row lines and the column lines; and dummy memory cells disposed between the insulating lines and the column lines. Thereby, read performance characteristics of the memory 1010 may be improved. Thereby, read operation characteristics of the microprocessor 1000 may be improved.

The operating component 1020 may perform various four-arithmetical operations or logical operations based on results of decoding commands by the controller 1030. For example, the operating component 1020 may include at least one arithmetic logic unit (ALU).

The controller 1030 may receive signals from, e.g., the memory 1010, the operating component 1020, and an external device of the microprocessor 1000, perform extraction or decoding of commands, and controlling input and output of signals of the microprocessor 1000, and execute processing represented by programs.

The microprocessor 1000 in accordance to the present embodiment may further include a cache memory 1040 which may temporarily store data to be input from an external device other than the memory 1010 or to be output to an external device. In this case, the cache memory 1040 may exchange data with the memory 1010, the operating component 1020, and the controller 1030 through a bus interface 1050.

Figure 12:
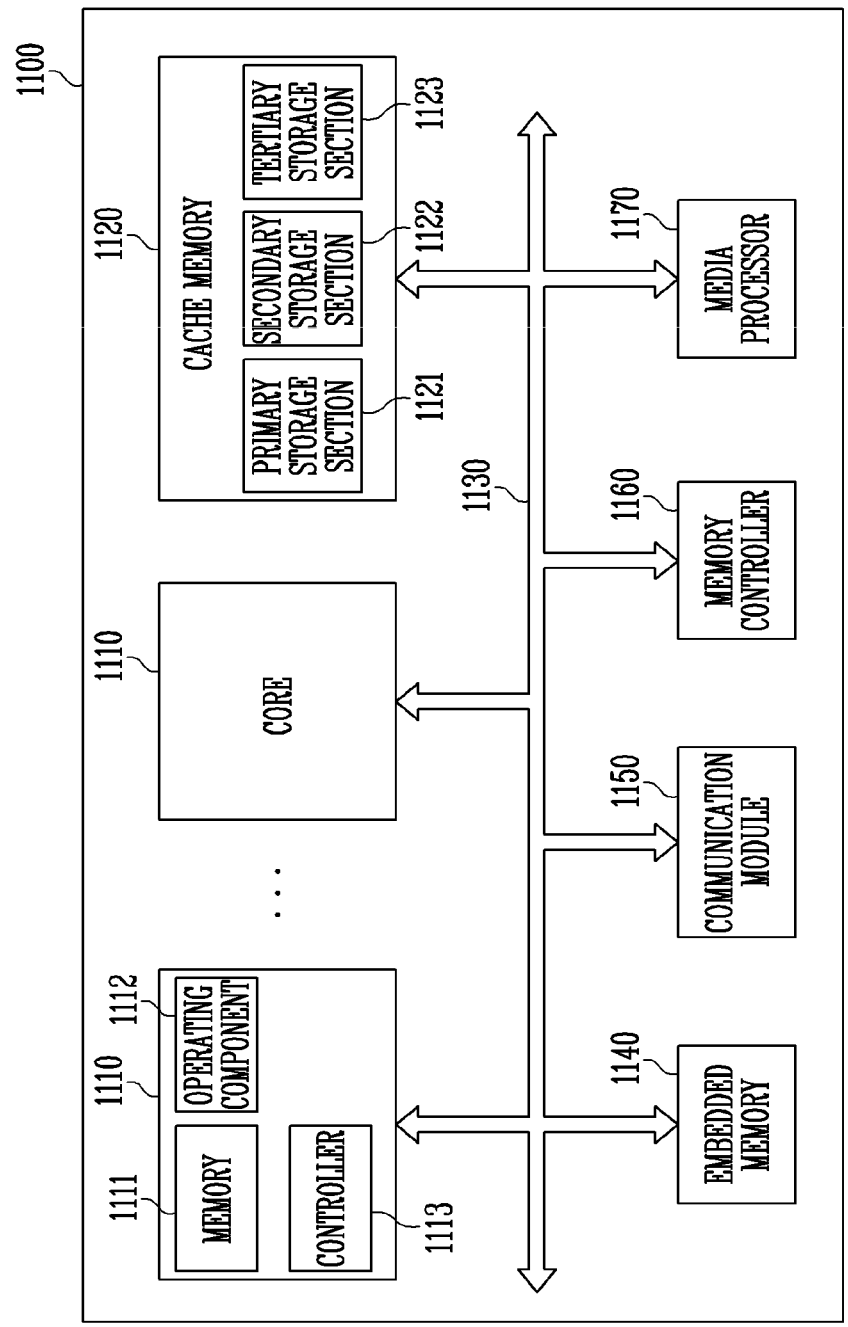
FIG. 12 is a diagram illustrating a processor which embodies a memory device in accordance with the embodiment.

FIG. 12 is a diagram illustrating a processor 1100 which embodies a memory device in accordance with the embodiment.

Referring to FIG. 12, the processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core 1110 which functions as a microprocessor, a cache memory 1120 configured to temporarily store data, and a bus interface 1130 configured to transfer data between internal and external devices. The processor 1100 may include various system-on-chips (SoCs) such as a multi-core processor, a graphic processing unit (GPU), and an application processor (AP).

The core 1110 in accordance with the present disclosure may be a circuit which performs arithmetic logic operations for data input from an external device, and may include a memory 1111, an operating component 1112, and a controller 1113.

The memory 1111 may be a circuit configured to store data in the processor 1100 as a processor register, a register, or the like. For example, the memory 1111 may include a data register, an address register, and a floating point register. In addition, the memory 1111 may include various registers. The memory 1111 may perform the function of temporarily storing data for which operations are to be performed by the operating component 1112, result data of performing the operations, and addresses where data for performing of the operations are stored. The operating component 1112 may be a circuit configured to perform operations in the processor 1100, and perform, e.g., various four-arithmetical operations or logical operations, based on results of decoding commands by the controller 1113. For example, the operating component 1112 may include at least one arithmetic logic unit (ALU). The controller 1113 may receive signals from, e.g., the memory 1111, the operating component 1112, and an external device of the processor 1100, perform extraction or decoding of commands, and controlling input and output of signals of the processor 1100, and execute processing represented by programs.

The cache memory 1120 may be a circuit which temporarily stores data to compensate for a difference in data processing speed between the core 1110 operating at a high speed and an external device operating at a low speed. The cache memory 1120 may include a primary storage section 1121, a secondary storage section 1122 and a tertiary storage section 1123. Generally, the cache memory 1120 includes the primary and secondary storage sections 1121 and 1122, and may include the tertiary storage section 1123 in the case where high storage capacity is required. As needed, the number of storage sections included in the cache memory 1120 may be increased. In other words, the number of storage sections included in the cache memory 1120 may be changed depending on design. Here, the speeds at which the primary, secondary, and tertiary storage sections 1121, 1122 and 1123 store and discriminate data may be the same or different from each other. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory 1120 may include one or more of the semiconductor devices in accordance with the above-described embodiments. For example, the cache memory 1120 may include: row lines; insulating lines extending parallel to the row lines; column lines which intersect with the row lines and the insulating lines and are disposed over the row lines and the insulating lines; memory cells disposed between the row lines and the column lines; and dummy memory cells disposed between the insulating lines and the column lines. Thereby, read performance characteristics of the cache memory 1120 may be improved. Consequently, the read operation characteristics of the processor 1100 may be improved.

Although FIG. 12 illustrates that all of the primary, secondary, and tertiary storage sections 1121, 1122 and 1123 are disposed inside the cache memory 1120, all of the primary, secondary and tertiary storage sections 1121, 1122 and 1123 of the cache memory 1120 may be disposed outside the core 1110 and may compensate for a difference in data processing speed between the core 1110 and the external device. Alternatively, the primary storage section 1121 of the cache memory 1120 may be disposed inside the core 1110, and the secondary storage section 1122 and the tertiary storage section 1123 may be disposed outside the core 1110 to reinforce the function of compensating for a difference in data processing speed. As a further alternative, the primary and secondary storage sections 1121 and 1122 may be disposed inside the core 1110 and the tertiary storage section 1123 may be disposed outside the core 1110.

The bus interface 1130 may be a circuit which connects the core 1110, the cache memory 1120 and an external device and enhances data transmission efficiency.

The processor 1100 in accordance with the present embodiment may include a plurality of cores 1110. The plurality of cores 1110 may share the cache memory 1120. The plurality cores 1110 and the cache memory 1120 may be directly connected or be connected through the bus interface 1130. The plurality of cores 1110 may be configured in the same way as the above-described configuration of the core 1110. In the case where the processor 1100 includes the plurality of cores 1110, the primary storage section 1121 of the cache memory 1120 may be configured in each core 1110 based on the number of cores 1110, and the secondary storage section 1122 and the tertiary storage section 1123 may be configured outside the plurality of cores 1110 in such a way as to be shared through the bus interface 1130. Here, the processing speed of the primary storage section 1121 may be higher than that of the secondary or tertiary storage section 1122 or 1123. In an embodiment, the primary storage section 1121 and the secondary storage section 1122 may be configured in each core 1110 based on the number of cores 1110, and the tertiary storage section 1123 may be configured outside the plurality of cores 1110 in such a way as to be shared through the bus interface 1130.

The processor 1100 in accordance with the present embodiment may further include, e.g., an embedded memory 1140 configured to store data, a communication module 1150 configured to transceive data with an external device in a wired or wireless manner, a memory controller 1160 configured to drive an external memory device, and a media processor 1170 configured to process the data processed in the processor 1100 or the data input from an external input device and output the processed data to an external interface device. In addition, the processor 1100 may include a plurality of modules and devices. In this case, the plurality of modules that are additionally provided may exchange data with the cores 1110 and the cache memory 1120 and with one another, through the bus interface 1130.

The embedded memory 1140 may include not only a volatile memory but also a nonvolatile memory. Examples of the volatile memory may include, e.g., a dynamic random access memory (DRAM), a mobile DRAM, a static random access memory (SRAM), and a memory having functions similar to that of the foregoing memories. Examples of the nonvolatile memory may include a read only memory (ROM), a NOR flash memory, a NAND flash memory, a phase change random access memory (PRAM), a resistive random access memory (RRAM), a spin transfer torque random access memory (STTRAM), a magnetic random access memory (MRAM), and a memory having functions similar to that of the foregoing memories.

The communication module 1150 may include a module capable of being connected with a wired network, a module capable of being connected with a wireless network, or both of them. The wired network module may include, e.g., a local area network (LAN), a universal serial bus (USB), an Ethernet, or power line communication (PLC), which is operated in a manner similar to that of various devices configured to transceive data through transfer lines. The wireless network module may include infrared data association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (CDMA), or ultra wideband (UWB), which is operated in a manner similar to that of various devices configured to transceive data without a separate transfer line.

The memory controller 1160 may process and manage data which is transmitted between the processor 1100 and external storage devices configured to operate according to different communication standards. The memory controller 1160 may include various memory controllers, for example, controllers which may control integrated device electronics (IDE), serial advanced technology attachment (SATA), small computer system interface (SCSI), redundant array of independent disks (RAID), a solid state disk (SSD), external SATA (eSATA), personal computer memory card international association (PCMCIA), a universal serial bus (USB), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), and a compact flash (CE) card.

Figure 13:
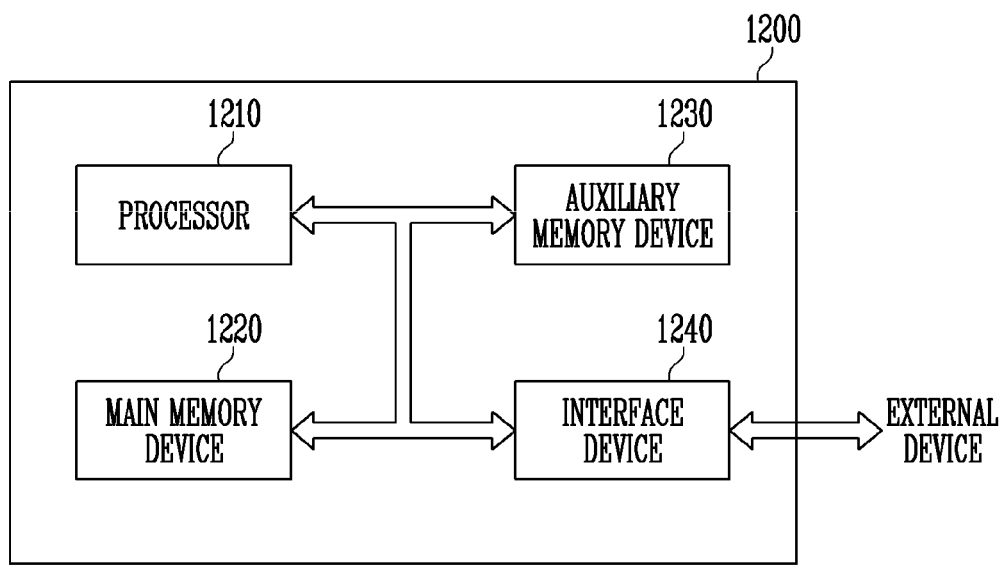
FIG. 13 is a diagram illustrating a system which embodies a memory device in accordance with the embodiment.

The media processor 1170 may process the data processed in the processor 1100 or the data input in the forms of image, sound, and others from the external input device, and output the data to the external interface device. The media processor 1170 may include, e.g., a graphic processing unit (GPU), a digital signal processor (DSP), a high definition audio device (HD audio), a high definition multimedia interface (HDMI) controller. FIG. 13 is a diagram illustrating a system 1200 which embodies a memory device in accordance with the embodiment.

Referring to FIG. 13, the system 1200 may function as a device for processing data and perform input, processing, output, communication, storage, etc. to conduct a series of operations of managing data. The system 1200 may include, e.g., a processor 1210, a main memory device 1220, an auxiliary memory device 1230, and an interface device 1240. Examples of the system 1200 in accordance with the present embodiment may include various electronic systems configured to operate using processors such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, telematics, an audio visual (AV) system, and a smart television.

The processor 1210 may control operations of decoding input commands and processing calculation, comparison, etc., for the data stored in the system 1200. The processor 1210 may include, e.g., a microprocessor unit (MPU), a central processing unit (CPU), a single/multi-core processor, a graphic processing unit (GPU), an application processor (AP), and a digital signal processor (DSP).

The main memory device 1220 may be a storage which can receive, when programs are executed, program codes or data from the auxiliary memory device 1230 and store and execute the program codes or data and can conserve memorized contents even when the power supply is interrupted. The main memory device 1220 may include one or more of the semiconductor devices in accordance with the above-described embodiments. For example, the main memory device 1220 may include: row lines; insulating lines extending parallel to the row lines; column lines which intersect with the row lines and the insulating lines and are disposed over the row lines and the insulating lines; memory cells disposed between the row lines and the column lines; and dummy memory cells disposed between the insulating lines and the column lines. Thereby, read performance characteristics of the main memory device 1220 may be improved. Consequently, the read operation characteristics of the system 1200 may be improved.

The main memory device 1220 may further include a static random access memory (SRAM), a dynamic random access memory (DRAM), and so on, of a volatile memory type in which all contents are erased when power supply is interrupted. Unlike this, the main memory device 1220 may not include the semiconductor devices in accordance with the foregoing embodiment, but may include a static random access memory (SRAM), a dynamic random access memory (DRAM), and so on, of a volatile memory type in which all contents are erased when the power supply is interrupted.

The auxiliary memory device 1230 may be a memory device configured to store program codes or data. Although the speed of the auxiliary memory device 1230 is slower than the main memory device 1220, the auxiliary memory device 1230 can store a relatively large amount of data. The auxiliary memory device 1230 may include one or more of the semiconductor devices in accordance with the above-described embodiments. For example, the auxiliary memory device 1230 may include: row lines; insulating lines extending parallel to the row lines; column lines which intersect with the row lines and the insulating lines and are disposed over the row lines and the insulating lines; memory cells disposed between the row lines and the column lines; and dummy memory cells disposed between the insulating lines and the column lines. Thereby, read performance characteristics of the auxiliary memory device 1230 may be improved. Consequently, the read operation characteristics of the system 1200 may be improved.

Also the auxiliary memory device 1230 may further include, e.g., a data storage system (refer to reference numeral 1300 of FIG. 14) such as a magnetic tape or a magnetic disk using magnetism, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), and a compact flash (CF) card. Unlike this, the auxiliary memory device 1230 may not include the semiconductor devices in accordance with the foregoing embodiment, but may further include, e.g., data storage systems (refer to reference numeral 1300 of FIG. 14) such as a magnetic tape or a magnetic disk using magnetism, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), and a compact flash (CF) card.

The interface device 1240 may perform exchange of commands and data between the system 1200 of the present embodiment and an external device. For example, the interface device 1240 may be a keypad, a keyboard a mouse, a speaker, a mike, a display, various human interface devices (HIDs), or a communication device. The communication device may include a module capable of being connected with a wired network, a module capable of being connected with a wireless network, or both of them. The wired network module may include, e.g., a local area network (LAN), a universal serial bus (USB), an Ethernet, or a power line communication (PLC), which is operated in a manner similar to that of various devices configured to transceive data through transfer lines. The wireless network module may include, e.g., infrared data association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), or ultra wideband (UWB), which is operated in a manner similar to that of various devices configured to transceive data without a separate transfer line.

Figure 14:
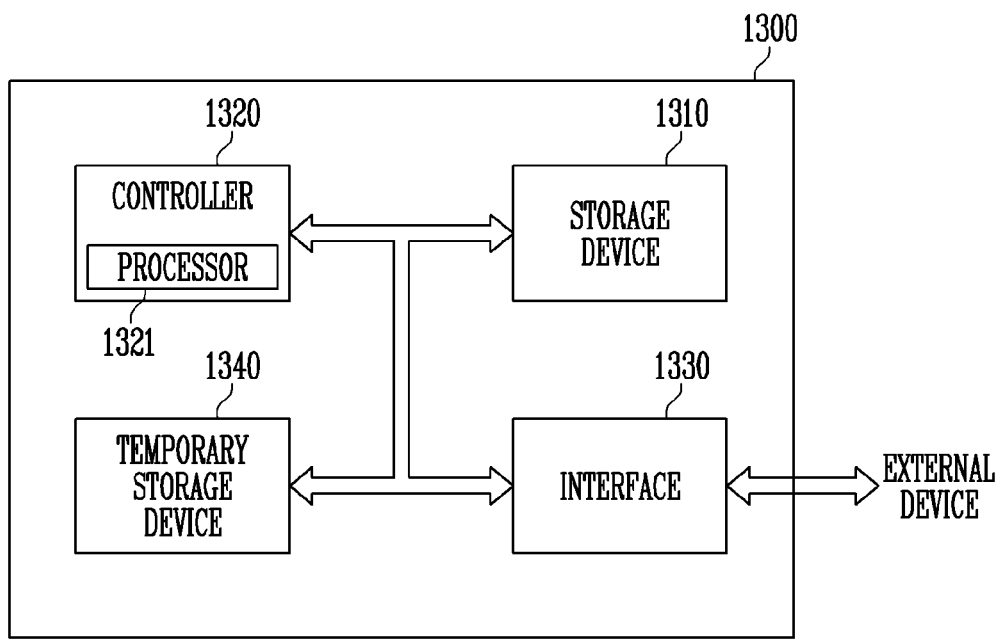
FIG. 14 is a diagram illustrating a data storage system which embodies a memory device in accordance with the embodiment.

FIG. 14 is a diagram illustrating a data storage system 1300 which embodies a memory device in accordance with the embodiment.

Referring to FIG. 14, the data storage system 1300 may include a storage device 1310 which has a nonvolatile characteristic as a component for storing data, a controller 1320 configured to control the storage device 1310, an interface 1330 for connection with an external device, and a temporary storage device 1340 configured to temporarily store data. The data storage system 1300 may be a disk type such as a hard disk drive (HDD), a compact disc read only memory (CDROM), a digital versatile disc (DVD), or a solid state disk (SSD), or a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), or a compact flash (CF) card.

The storage device 1310 may include a nonvolatile memory which stores data semi-permanently. Examples of the nonvolatile memory may include a read only memory (ROM), a NOR flash memory, a NAND flash memory, a phase change random access memory (PRAM), a resistive random access memory (RRAM), and a magnetic random access memory (MRAM).

The controller 1320 may control data exchange between the storage device 1310 and the interface 1330. To this end, the controller 1320 may include a processor 1321 for performing, e.g., an operation for processing commands input through the interface 1330 from an outside of the data storage system 1300.

The interface 1330 may perform exchange of commands and data between the data storage system 1300 and the external device. In the case where the data storage system 1300 is a card type system, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), and a compact flash (CF) card, or be compatible with interfaces which are used in devices similar to the foregoing devices. In the case where the data storage system 1300 is a disk type system, the interface 1330 may be compatible with interfaces such as an integrated device electronics (IDE), a serial advanced technology attachment (SATA), a small computer system interface (SCSI), an external SATA (eSATA), a personal computer memory card international association (PCMCIA), and a universal serial bus (USB), or be compatible with the interfaces similar to the foregoing interfaces. The interface 1330 may be compatible with one or more interfaces having different types.

The temporary storage device 1340 may temporarily store data to improve data transfer efficiency between the interface 1330 and the storage device 1310 according to diversifications and high performance of an interface with an external device, a controller, and a system. The temporary memory device 1340 may include one or more of the semiconductor devices in accordance with the foregoing embodiments. For example, the temporary memory device 1340 may include: row lines; insulating lines extending parallel to the row lines; column lines which intersect with the row lines and the insulating lines and are disposed over the row lines and the insulating lines; memory cells disposed between the row lines and the column lines; and dummy memory cells disposed between the insulating lines and the column lines. Thereby, read performance characteristics of the temporary storage device 1340 may be improved. Consequently, the read operation characteristics of the data storage system 1300 may be improved.

Figure 15:
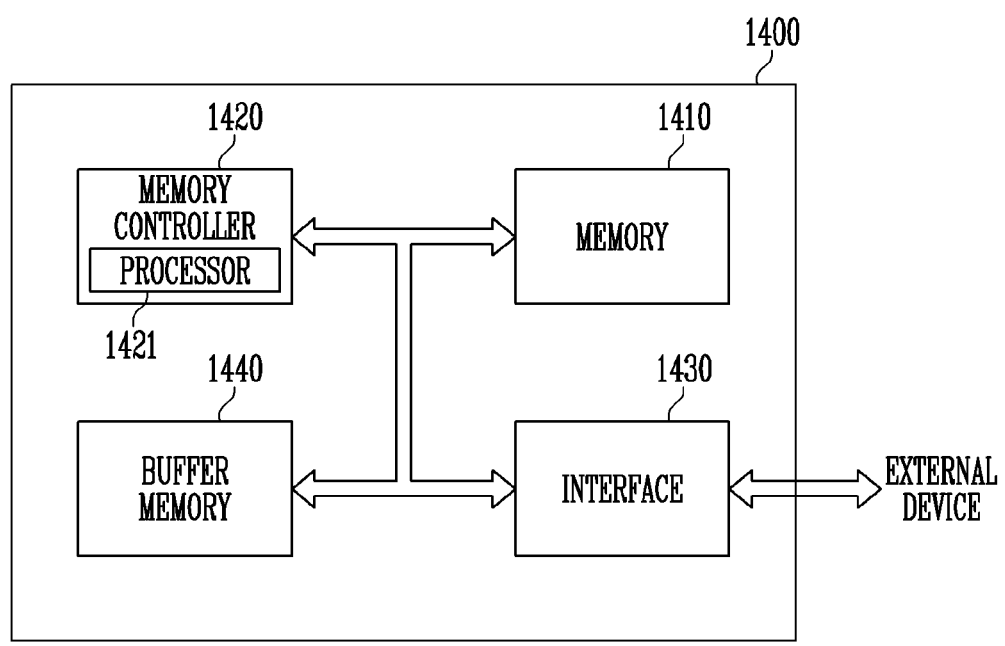
FIG. 15 is a diagram illustrating a memory system which embodies a memory device in accordance with the embodiment.

FIG. 15 is a diagram illustrating a memory system 1400 which embodies a memory device in accordance with the embodiment.

Referring to FIG. 15, the memory system 1400 may include, e.g., a memory 1410 having nonvolatile characteristics as a component for storing data, a memory controller 1420 configured to control the memory 1410, an interface 1430 for connection with an external device. Also the memory system 1400 may be a card type system such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), or a compact flash (CF) card.

The memory 1410 configured to store data may include one or more of the semiconductor devices in accordance with the foregoing embodiments. For example, the memory 1410 may include: row lines; insulating lines extending parallel to the row lines; column lines which intersect with the row lines and the insulating lines and are disposed over the row lines and the insulating lines; memory cells disposed between the row lines and the column lines; and dummy memory cells disposed between the insulating lines and the column lines. Thereby, read performance characteristics of the memory 1410 may be improved. Consequently, the read operation characteristics of the memory system 1400 may be improved.

Examples of the nonvolatile memory in accordance with the present embodiment may include a read only memory (ROM), a NOR flash memory, a NAND flash memory, a phase change random access memory (PRAM), a resistive random access memory (RRAM), and a magnetic random access memory (MRAM).

The memory controller 1420 may control data exchange between the memory 1410 and the interface 1430. To this end, the memory controller 1420 may include a processor 1421 for performing, e.g., an operation for processing commands input through the interface 1430 from an outside of the memory system 1400.

The interface 1430 may perform exchange of commands and data between the memory system 1400 and the external device. The interface 1430 may be compatible with interfaces which are used in devices, such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, or be compatible with interfaces which are used in devices similar to the foregoing devices. The interface 1430 may be compatible with one or more interfaces having different types.

The memory system 1400 in accordance with the present embodiment may further include a buffer memory 1440 for improving data transfer efficiency between the interface 1430 and the memory 1410 according to diversification and high performance of an interface with an external device, a memory controller, and a memory system. The buffer memory 1440 configured to temporarily store data may include one or more of the semiconductor devices in accordance with the foregoing embodiments. For example, the buffer memory 1440 may include: row lines; insulating lines extending parallel to the row lines; column lines which intersect with the row lines and the insulating lines and are disposed over the row lines and the insulating lines; memory cells disposed between the row lines and the column lines; and dummy memory cells disposed between the insulating lines and the column lines. Consequently, the read operation characteristics of the memory system 1400 may be improved.

In addition, examples of the buffer memory 1440 in accordance with the present embodiment may further include, e.g., a static random access memory (SRAM), and a dynamic random access memory (DRAM), which have a volatile characteristic, and a phase change random access memory (PRAM), a resistive random access memory (RRAM), a spin transfer torque random access memory (STTRAM), and a magnetic random access memory (MRAM), which have a nonvolatile characteristic. Unlike this, examples of the buffer memory 1440 may not include the semiconductor device in accordance with the foregoing embodiment, but may further include, e.g., a static random access memory (SRAM), and a dynamic random access memory (DRAM), which have a volatile characteristic, and a phase change random access memory (PRAM), a resistive random access memory (RRAM), a spin transfer torque random access memory (STTRAM), and a magnetic random access memory (MRAM), which have a nonvolatile characteristic.

Various embodiments of the present disclosure may provide an electronic device having improved operating characteristics and reliability.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An electronic device comprising a semiconductor memory, wherein the semiconductor memory comprises:
   row lines;
   insulating lines extending parallel to the row lines;
   column lines intersecting with the row lines and the insulating lines and disposed over the row lines and the insulating lines;
   memory cells respectively disposed at intersections between the row lines and the column lines;

dummy memory cells respectively disposed at intersections between the insulating lines and the column lines; and an insulating layer between a row line and an insulating line adjacent to each other, among the row lines and the insulating lines, wherein the dummy memory cells respectively overlap the insulating lines in a direction in which the row lines face the column lines, and wherein the insulating layer extends a space between a memory cell and a dummy memory cell adjacent to each other, among the memory cells and the dummy memory cells.

2. The electronic device according to claim 1, wherein each of the memory cells comprises a lower electrode, a switching layer, an intermediate electrode, a variable resistance layer, and an upper electrode, and each of the dummy memory cells comprises a lower electrode, a switching layer, an intermediate electrode, a variable resistance layer, and an upper electrode.

3. The electronic device according to claim 1, wherein each of the memory cells comprises a lower electrode, a switching layer, an intermediate electrode, a variable resistance layer, and an upper electrode, and each of the dummy memory cells comprises a switching layer, an intermediate electrode, a variable resistance layer, and an upper electrode.

4. The electronic device according to claim 2, wherein an upper surface of each of the insulating lines is disposed on a level substantially the same as a level of an upper surface of each of the row lines.

5. The electronic device according to claim 3, wherein an upper surface of each of the insulating lines is disposed on a level substantially the same as a level of an upper surface of the lower electrode.

6. The electronic device according to claim 1, wherein at least a portion of each of the row lines and at least a portion of each of the insulating lines are disposed on substantially the same level.

7. The electronic device according to claim 1, wherein each of the insulating lines has an upper width and a lower width, the lower width being greater than the upper width.

8. The electronic device according to claim 1, wherein each of the row lines has an upper width and a lower width, the lower width being greater than the upper width.

9. The electronic device according to claim 1, wherein the insulating lines are spaced apart from the row lines in a direction crossing the row lines.

10. The electronic device according to claim 1, wherein the insulating lines are disposed at edges of a cell array.

11. The electronic device according to claim 1, wherein the dummy memory cells are electrically disabled.

12. An electronic device comprising a semiconductor memory, wherein the semiconductor memory comprises:
a row line and an insulating line adjacent to each other in a first direction;
a column line disposed over the row line and the insulating line, the column line extending in the first direction;
a memory cell disposed between the row line and the column line; and
a dummy memory cell disposed between the insulating line and the column line,
wherein a space between the memory cell and the dummy memory cell is aligned in a vertical direction with a space between the row line and the insulating line,
wherein the semiconductor memory further comprises a first insulating layer between the row line and the insulating line, and
wherein the first insulating layer extends into the space between the memory cell and the dummy memory cell adjacent to each other in the first direction.

13. The electronic device according to claim 12, wherein the semiconductor memory further comprises a second insulating layer disposed over the insulating line and the row line.

14. An electronic device comprising a semiconductor memory, wherein the semiconductor memory comprises:
row lines;
insulating lines extending parallel to the row lines;
column lines intersecting with the row lines and the insulating lines and disposed over the row lines and the insulating lines;
memory cells respectively disposed at intersections between the row lines and the column lines; and
dummy memory cells respectively disposed at intersections between the insulating lines and the column lines,
wherein the dummy memory cells respectively overlap the insulating lines in a direction in which the row lines face the column lines,
wherein the insulating lines include an edge insulating line adjacent to the row lines,
wherein the dummy memory cells include an edge dummy memory cell disposed on the edge insulating line,
wherein the row lines include an edge row line adjacent to the insulating lines,
wherein the memory cells include an edge memory cell disposed on the edge row line,
wherein the semiconductor memory further comprises an insulating layer disposed in a space between the edge insulating line and the edge row line , and
wherein the insulating layer extends into a space between the edge memory cell and the edge dummy memory cell.

* * * * *